US012782107B2

(12) United States Patent
Choi et al.

(10) Patent No.: US 12,782,107 B2
(45) Date of Patent: Nov. 3, 2026

(54) SEMICONDUCTOR MEASUREMENT DEVICE

(71) Applicant: Samsung Electronics Co., Ltd., Suwon-si (KR)

(72) Inventors: Garam Choi, Suwon-si (KR); Wookrae Kim, Suwon-si (KR); Jinseob Kim, Suwon-si (KR); Jinyong Kim, Suwon-si (KR); Younguk Jin, Suwon-si (KR); Charles Soon Hong Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 89 days.

(21) Appl. No.: 18/914,828

(22) Filed: Oct. 14, 2024

(65) Prior Publication Data

US 2025/0297849 A1 Sep. 25, 2025

(30) Foreign Application Priority Data

Mar. 19, 2024 (KR) ........................ 10-2024-0037917

(51) Int. Cl.
*G01B 9/02* (2022.01)
*G01B 9/02097* (2022.01)
(Continued)

(52) U.S. Cl.
CPC ..... *G01B 9/02041* (2013.01); *G01B 9/02097* (2013.01); *G06T 7/0004* (2013.01);
(Continued)

(58) Field of Classification Search
CPC ............ G01B 9/02097; G01B 11/2441; G01B 2210/56; G01B 2290/70
See application file for complete search history.

(56) References Cited

U.S. PATENT DOCUMENTS 10,018,919 B2 7/2018 Lee et al.
2012/0008483 A1 1/2012 Mikami et al.
(Continued)

FOREIGN PATENT DOCUMENTS

CN 117213361 A 12/2023
KR 10-2021-0065007 A 6/2021
KR 10-2023-0003886 A 1/2023

OTHER PUBLICATIONS

De Groot, P., "Principles of interference microscopy for the measurement of surface topography", Advances in Optics and Photonics, 2015, pp. 1-65.

(Continued)

*Primary Examiner* — Michael A Lyons
(74) *Attorney, Agent, or Firm* — Morgan, Lewis & Bockius LLP

(57) ABSTRACT

A semiconductor measurement device includes a light source configured to generate a laser beam, a polarization unit arranged on a path of the laser beam generated from the light source, and configured to separate the laser beam into a first beam and a second beam, a beam splitter configured to make the first beam and the second beam, having been separated by the polarization unit, incident on a top surface of a semiconductor substrate, a multiplex self-interference generation unit configured to separate a beam reflected from the top surface of the semiconductor substrate into a third beam and a fourth beam and to cause multiplex self-interference of the third beam and the fourth beam, and a detection unit configured to detect a multiplex self-interference image generated from the third beam and the fourth beam, wherein the polarization unit may include a polarization unit delayer.

19 Claims, 13 Drawing Sheets

(51) Int. Cl.
*G01B 11/24* (2006.01)
*G01B 11/27* (2006.01)
*G06T 7/00* (2017.01)
*H10P 74/20* (2026.01)

(52) U.S. Cl.
CPC ........ *G01B 11/2441* (2013.01); *G01B 11/272* (2013.01); *G01B 2210/56* (2013.01); *G01B 2290/70* (2013.01); *G06T 2207/10152* (2013.01); *G06T 2207/30148* (2013.01); *H10P 74/203* (2026.01)

(56) References Cited

U.S. PATENT DOCUMENTS

| | | | |
|---|---|---|---|
| 2016/0016124 | A1 | 1/2016 | Zheng et al. |
| 2021/0156790 | A1 | 5/2021 | Hidaka et al. |
| 2022/0035257 | A1 | 2/2022 | Goorden et al. |
| 2022/0074848 | A1 | 3/2022 | Jung et al. |
| 2022/0350261 | A1* | 11/2022 | Chen ...................... G01B 11/14 |
| 2022/0404143 | A1* | 12/2022 | Pandev ............... G03F 7/70633 |
| 2023/0000343 | A1 | 1/2023 | Kim et al. |
| 2023/0184535 | A1* | 6/2023 | Lee .................... G01B 9/02063 356/450 |
| 2023/0186460 | A1* | 6/2023 | Lee ....................... G06T 7/0004 348/87 |
| 2023/0400404 | A1 | 12/2023 | Choi et al. |
| 2024/0133673 | A1 | 4/2024 | Choi et al. |

OTHER PUBLICATIONS

Dixit, D., et al., "Silicon fin line edge roughness determination and sensitivity analysis by Mueller matrix spectroscopic ellipsometry based scatterometry", Metrology, Inspection, and Process Control for Microlithography XXIX, Apr. 10, 2015, pp. 1-16, vol. 9424.

* cited by examiner

SEMICONDUCTOR MEASUREMENT DEVICE

CROSS-REFERENCE TO RELATED APPLICATION

This application is based on and claims the benefit of priority under 35 U.S.C. § 119 to Korean Patent Application No. 10-2024-0037917, filed on Mar. 19, 2024 in the Korean Intellectual Property Office, the disclosure of which is incorporated by reference herein in its entirety.

TECHNICAL FIELD

The inventive concept relates to a semiconductor measurement device, and more particularly, to a semiconductor measurement device that performs optimized overlay measurements by extracting off-diagonal components of the Mueller matrix with one shot.

BACKGROUND

Overlay margins decrease due to miniaturization of semiconductor structures, and in-cell overlay measurement and key overlay measurement are both required. Accordingly, there is a need for a technology that reduces the size of a spot to be measured and quickly performs overlay measurement. To overcome this, technology to reduce the number of shots for overlay measurement and obtain measurements for all angles with one shot is continuously being researched and developed.

SUMMARY

The inventive concept provides a semiconductor measurement device with improved reliability.

According to an aspect of the inventive concept, there is provided a semiconductor measurement device including a light source configured to generate a laser beam, a polarization unit arranged on a path of the laser beam generated from the light source and configured to separate the laser beam into a first beam and a second beam, a beam splitter configured to make the first beam and the second beam having been separated by the polarization unit incident on a top surface of a semiconductor substrate, a multiplex self-interference generation unit configured to separate a beam reflected from the top surface of the semiconductor substrate into a third beam and a fourth beam and to cause multiplex self-interference of the third beam and the fourth beam, and a detection unit configured to detect a multiplex self-interference image generated from the third beam and the fourth beam, wherein the polarization unit may include a polarization unit delayer.

According to another aspect of the inventive concept, there is provided a semiconductor measurement device including a polarization unit configured to separate a laser beam output from a light source into a plurality of beams, each having different polarization information, an objective lens configured to focus the plurality of beams onto a semiconductor substrate and to generate a pupil image through beams reflected from the semiconductor substrate, a multiplex self-interference generation unit configured to separate the pupil image, which is a beam reflected from a top surface of the semiconductor substrate, into a plurality of beams and to cause multiplex self-interference of the plurality of beams, a detection unit configured to detect a multiplex self-interference image generated from the pupil image, and an analysis unit configured to extract only an off-diagonal component from Mueller matrix components calculated from the multiplex self-interference image, wherein the polarization unit may include a polarization unit delayer, a polarization unit lens array including at least two lenses, and a polarizer, the polarization unit delayer is spaced apart from the polarization unit lens array in a direction parallel to a traveling direction of the laser beam, and the multiple self-interference generation unit may include a multiplex self-interference generation unit delayer, a multiplex self-interference generation unit lens array including at least two lenses, and an analyzer.

According to still another aspect of the inventive concept, there is provided a semiconductor measurement device including a light source configured to generate a laser beam, a polarization unit configured to separate the laser beam into a first beam and a second beam each having different polarization information, a beam splitter configured to allow a plurality of beams having different polarization information to be incident onto a top surface of a semiconductor substrate, an objective lens spaced vertically from the beam splitter and configured to generate a pupil image through beams reflected from the semiconductor substrate, a multiplex self-interference generation unit configured to separate the pupil image, which is a beam reflected from the top surface of the semiconductor substrate, into a third beam and a fourth beam each having different polarization information, and to cause multiplex self-interference of the third beam and the fourth beam, a detection unit configured to detect a multiplex self-interference image generated from the pupil image, and an analysis unit configured to calculate a degree of polarization (DOP) by extracting only an off-diagonal component of Mueller matrix components calculated from the multiplex self-interference image, wherein the polarization unit may include a polarization unit delayer configured to delay a phase of each of the first beam and the second beam, and the multiplex self-interference generation unit may include a multiplex self-interference generation unit delayer configured to delay a phase of each of the third beam and the fourth beam.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
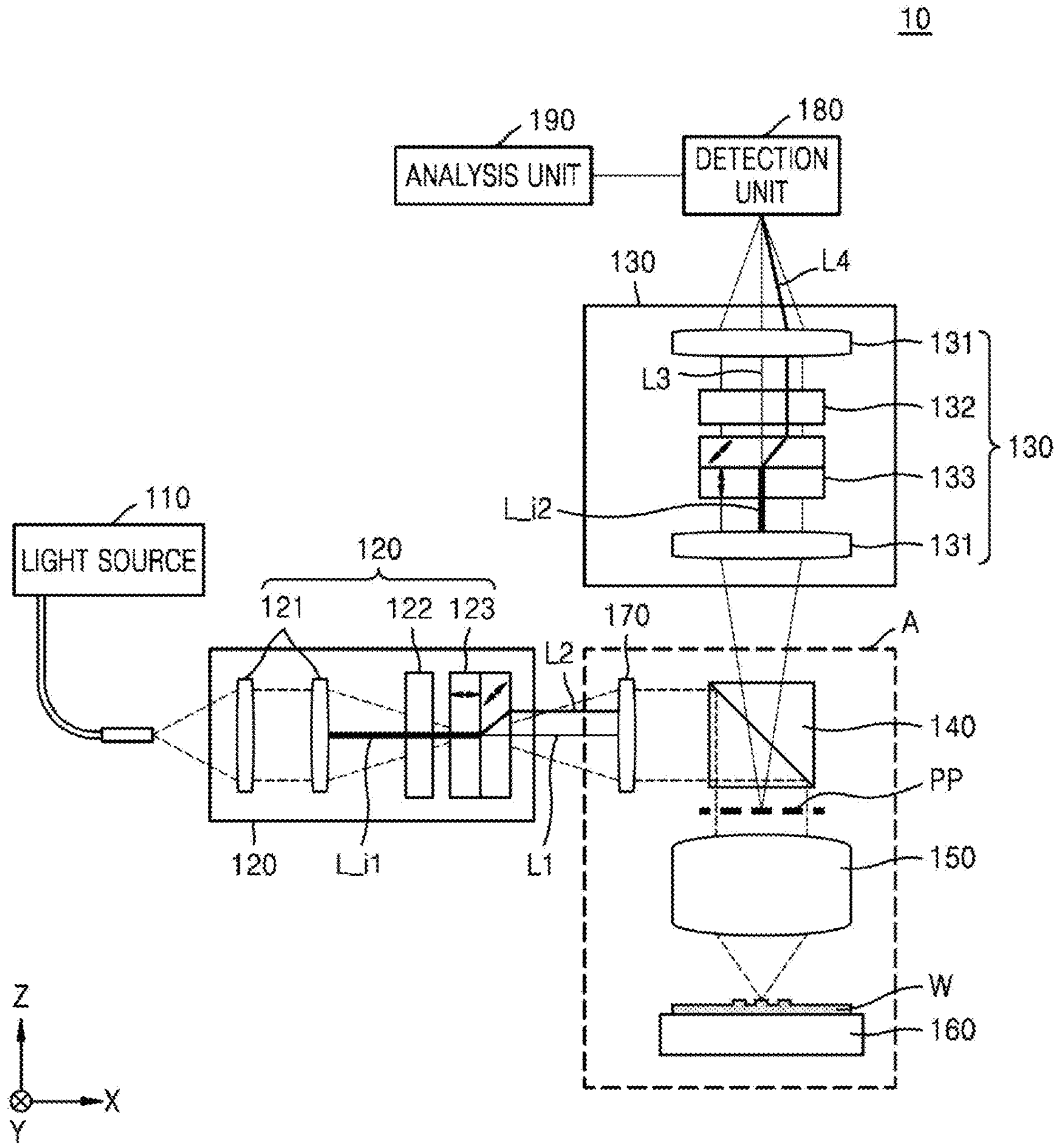
FIG. 1 is a structural diagram illustrating semiconductor measurement equipment according to an embodiment of the present disclosure.

Since the present embodiments may be modified in various ways and may have various forms, some embodiments are illustrated in the drawings and described in detail. However, it is not intended to limit the present embodiments to the particular disclosed forms. In addition, embodiments described below are merely illustrative, and various modifications are possible from these embodiments.

The use of all examples or example terms is merely intended to describe the technical idea in detail and is not intended to be limiting in scope by such examples or example terms, unless being limited by the claims.

Hereinafter, unless otherwise specified, in the present disclosure, a vertical direction may be defined in a Z direction, and a first horizontal direction and a second horizontal direction may be defined in horizontal directions perpendicular to the Z direction, respectively. The first horizontal direction may be referred to as X, and the second horizontal direction may be referred to as Y. A vertical level may refer to a height level according to the vertical direction Z. A first horizontal direction and a horizontal width may refer to a length in the horizontal direction X and/or Y, and a vertical length may refer to a length in the vertical direction Z.

FIG. 1 is a structural diagram illustrating semiconductor measurement equipment according to an embodiment of the present disclosure.

Referring to FIG. 1, a semiconductor measurement device 10 may measure a semiconductor substrate W to be measured by reflectometry, ellipsometry, holography, and/or interferometry.

The semiconductor measurement device 10 may include a light source 110 that generates a laser beam L_i1. In an embodiment, the laser beam L_i1 generated from the light source 110 may be a wideband laser beam L_i1. The wideband laser beam L_i1 may have a wide wavelength band and may have a plurality of colors. In an embodiment, the wideband laser beam L_i1 may have a range from a wavelength region of infrared rays to a wavelength region of ultraviolet rays.

In an embodiment, the light source 110 may include a monochromator outputting monochromatic light of the wideband laser beam L_i1. Monochromatic light may mean light having a very small wavelength range. The monochromator may include grating and/or a prism capable of spectroscopically separating the laser beam L_i1 by wavelength, but is not limited thereto.

The semiconductor measurement device 10 may include a polarization unit 120, and the polarization unit 120 may include a polarization unit lens array 121 including a plurality of lenses of at least two lenses. Although FIG. 1 illustrates that the polarization unit lens array 121 includes only two lenses, the number of lenses is not limited to two in the drawing. The polarization unit 120 may be arranged on a path of the laser beam L_i1. In an embodiment, the polarization unit lens array 121 included in the polarization unit 120 may condense the laser beam L_i1 to a specific focus. The polarization unit 120 may separate the laser beam L_i1 generated from the light source 110 into a plurality of beams of at least two beams. In the drawing, the laser beam L_i1 is separated into a first beam L1 and a second beam L2, but the number of separated beams is not limited to the number in the drawing.

The polarization unit 120 may include a polarizer 122 and a polarization unit delayer 123. A focus at which the polarization unit lens array 121 included in the polarization unit 120 condenses the laser beam L_i1 may coincide with the center of the polarization unit delayer 123.

In embodiments, the polarization unit lens array 121 may include two lenses, and the laser beam L_i1 incident on the polarization unit lens array 121 may be incident on either the polarizer 122 or the polarization unit delayer 123. The polarization unit lens array 121 may condense the laser beam L_i1 and allow the laser beam L_i1 to be imaged and then incident on the polarizer 122. The laser beam L_i1 incident on the polarizer 122 may be incident on the polarization unit delayer 123.

The polarization unit delayer 123 may be arranged to be spaced apart from the polarization unit lens array 121 in a direction parallel to the traveling direction of the laser beam L_i1. The polarization unit delayer 123 may include a material (e.g., calcite, etc.) having birefringence, and may include any one of a beam displacer, a Wollaston prism, a polarizing prism, a grating, or a combination thereof. Accordingly, the polarization unit delayer 123 may form a plurality of beams, which are incident on the semiconductor substrate W.

Although FIG. 1 shows that elements of the polarization unit 120 are spaced apart from each other in the first horizontal direction X, embodiments are not limited thereto. When the traveling direction of the laser beam L_i1 is the second horizontal direction Y or the vertical direction Z orthogonal to the first horizontal direction X, the polarization unit delayer 123 may be spaced apart from the polarization unit lens array 121 in the second horizontal direction Y or vertical direction Z. The polarizer 122 may be arranged between the polarization unit lens array 121 and the polarization unit delayer 123.

The polarizer 122 may be arranged in plural. Although only one polarizer 122 is arranged in FIG. 1, two or more polarizers 122 may be arranged. The polarizer 122 may polarize the laser beam L_i1 while changing the polarization direction. In an embodiment, the polarizer 122 may perform S-polarization on the first beam L1 separated from the laser beam L_i1, and the polarizer 122 may perform P-polarization on the second beam L2 separated from the laser beam L_i1. Directions and properties for S-polarized light and P-polarized light mentioned according to one embodiment of the inventive concept may be described in detail with reference to FIG. 5.

The polarization unit delayer 123 may be configured to delay phase of each of the first beam L1 and the second beam L2. The first beam L1 and the second beam L2 having different polarization information may be incident on the semiconductor substrate W.

The semiconductor measurement device 10 may include a beam splitter 140 configured to allow the first beam L1 and the second beam L2 separated by the polarization unit 120 to be incident onto a top surface of the semiconductor substrate W, and a lens array 170 configured to condense the first beam L1 and the second beam L2 onto the beam splitter 140. The beam splitter 140 may be configured to emit light reflected from the semiconductor substrate W, which is a measurement target, to a multiplex self-interference generation unit 130 included in the semiconductor measurement device 10.

The semiconductor measurement device 10 may include an objective lens 150 that is spaced apart from the beam splitter 140 in the vertical direction Z and generates a pupil (PP) image through beams reflected from the semiconductor substrate W. The objective lens 150 may condense each of the first beam L1 and the second beam L2 on the semiconductor substrate W. The semiconductor substrate W may be arranged on a semiconductor substrate stage 160. The semiconductor substrate stage 160 may move in the first horizontal direction X, the second horizontal direction Y, and the vertical direction Z orthogonal to the first horizontal direction X and the second horizontal direction Y. When the semiconductor substrate stage 160 moves, the semiconductor substrate W to be measured may also move.

The objective lens 150 may condense polarized light emitted from the polarization unit 120 and make the condensed polarized light incident on the semiconductor substrate W to be measured. The objective lens 150 may be arranged to focus on a top surface of the semiconductor substrate W to be measured. Even if the focus does not occur, the semiconductor substrate stage 160 may move so that the focus is formed on the top surface of the semiconductor substrate W.

In an embodiment, the objective lens 150 may provide a pupil (PP) image. The PP image of the semiconductor substrate W to be measured may mean an image of the semiconductor substrate W formed on a pupil plane of the objective lens 150. Here, the PP plane may refer to a back focal plane of the objective lens 150. That is, the objective lens 150 may form a PP image on the PP plane from the light reflected from the semiconductor substrate W. Details of the PP plane will be described with reference to FIGS. 2 and 3.

The semiconductor measurement device 10 may include a multiplex self-interference generation unit 130 configured to separate the beam L_i2 reflected from the top surface of the semiconductor substrate W into a third beam L3 and a fourth beam L4, and to perform multiplex self-interference of the third beam L3 and the fourth beam LA. In an embodiment, the beam L_i2 reflected from the top surface of the semiconductor substrate W may correspond to the PP image formed by the aforementioned objective lens 150. That is, the multiplex self-interference generation unit 130 may be configured to separate the PP image, which is a beam reflected from the top surface of the semiconductor substrate W, into the plurality of beams of at least two beams, and to perform multiplex self-interference of the plurality of beams. In an embodiment, the multiplex self-interference generation unit 130 may separate the beam reflected from the top surface of the semiconductor substrate W into the third beam L3 and the fourth beam L4, but the number of separated beams is not limited thereto, and this is only an example.

The multiple self-interference generation unit 130 may include a multiplex self-interference generation unit delayer 133, a multiplex self-interference generation unit lens array 131 including at least two lenses, and an analyzer 132. The analyzer 132 and the multiple self-interference generation unit delayer 133 may be arranged between the two lenses of the multiple self-interference generation unit lens array 131. The multiplex self-interference generation unit delayer 133 may be configured to delay the phase of each of the third beam L3 and the fourth beam L4 separated from the beam reflected from the top surface of the semiconductor substrate W.

The multiplex self-interference generation unit delayer 133 may include a material (e.g., calcite) having birefringence, and may include any one of a beam displacer, a Wollaston prism, a polarizing prism, a grating, or a combination thereof. Accordingly, the multiplex self-interference generation unit delayer 133 may form a plurality of beams separated from the PP image of the semiconductor substrate W. The plurality of separated beams may interfere with each other to generate a self-interference image for the PP image. For example, although not shown in the drawing, the multiplex self-interference generation unit delayer 133 may include a plurality of delayers sequentially arranged in the vertical direction Z, which is the traveling direction of the incident beam L_i2 incident on the multiplex self-interference generation unit 130. Each of the plurality of delayers may have birefringence.

In one embodiment, the third beam L3 may be S-polarized, and the fourth beam L4 may be P-polarized. The multiplex self-interference generation unit delayer 133 may correspond to the polarization unit delayer 123 included in the polarization unit 120. The first beam L1 may correspond to the third beam L3, and the second beam L2 may correspond to the fourth beam L4. The third beam L3 and the fourth beam L4 separated by the multiplex self-interference generation unit delayer 133 may pass through the analyzer 132. The third beam L3 and the fourth beam LA that have passed through the analyzer 132 may penetrate at least one lens of the multiplex self-interference generation unit lens array 131 included in the multiplex self-interference generation unit 130 to reach the detection unit 180.

The detection unit 180 included in the semiconductor measurement device 10 may be, for example, a PP camera. The detection unit 180 may be configured to detect a multiplex self-interference image generated from the third beam L3 and the fourth beam L4. In other words, the detection unit 180 may be configured to detect a multiplex self-interference image generated from the PP image. The detection unit 180 may include one of a complementary metal oxide semiconductor (CMOS), a charged coupled device (CCD), or a combination thereof. The detection unit 180 may transmit the PP image generated from the third beam L3 and the fourth beam L4 to an analysis unit 190 of the semiconductor measurement device 10. The detection unit 180 may generate an image having various exposure times based on the plurality of beams reflected from the semiconductor substrate W, which is the measurement target. In addition, the detection unit 180 may generate an image having various wavelengths based on the light reflected from the semiconductor substrate W.

The semiconductor measurement device 10 may include the analysis unit 190 configured to extract only off-diagonal components from Mueller matrix components calculated from the multiplex self-interference image. The analysis unit 190 may be configured to calculate the degree of polarization (DOP) through the extracted off-diagonal component. The analysis unit 190 may calculate not only the DOP but also a phase difference A and an intensity difference ψ.

The analysis unit 190 of the semiconductor measurement device 10 according to an exemplary embodiment of the present disclosure may be a processor (e.g., computer, microprocessor, CPU, ASIC, circuitry, logic circuits, etc.). The analysis unit 190 may be implemented by a non-transitory memory storing, e.g., a program(s), software instructions reproducing algorithms, etc., which, when executed, performs various functions described hereinafter, and a processor configured to execute the program(s), software instructions reproducing algorithms, etc. Herein, the memory and the processor may be implemented as separate semiconductor circuits. Alternatively, the memory and the processor may be implemented as a single integrated semiconductor circuit. The processor may embody one or more processor(s).

The measurement method for the multiplex self-interference image of the analysis unit 190 is described in detail with reference to FIGS. 8 and 9.

Figure 2:
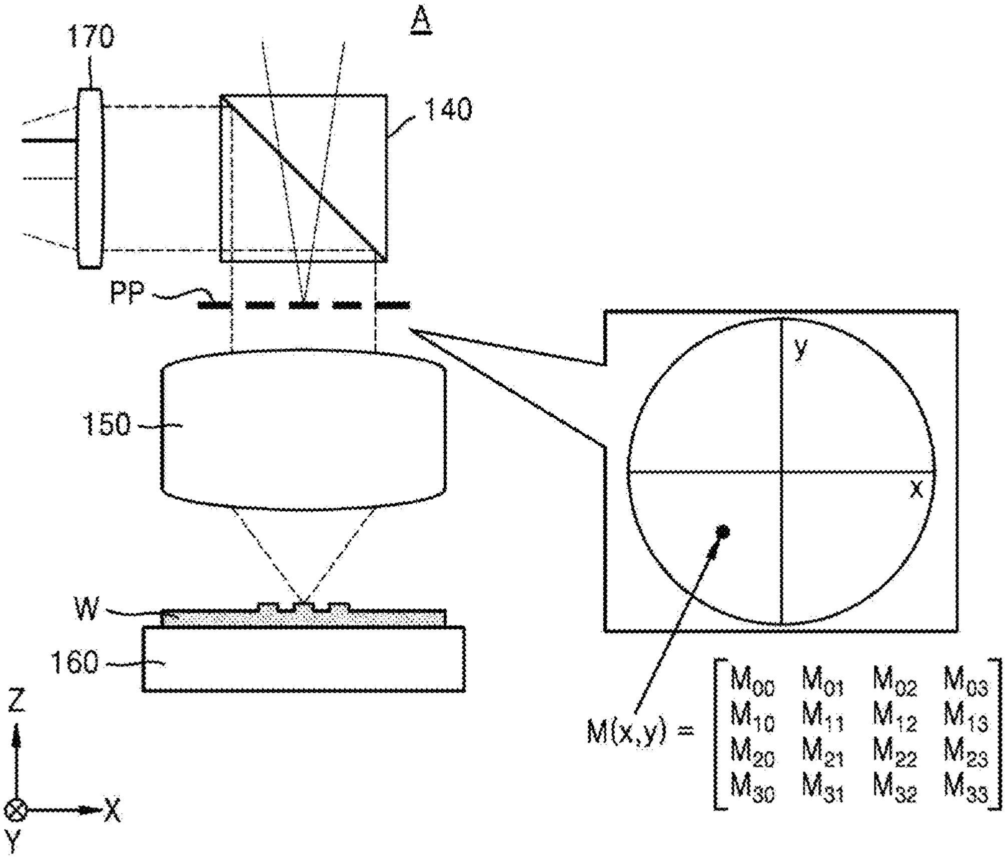
FIG. 2 is an enlarged view of a region A of FIG. 1.

FIG. 2 is an enlarged view of a region A of FIG. 1. Reference is made to FIG. 2 along with FIG. 1.

Information on the PP image corresponding to the back focus of the objective lens 150 may be expressed through the Mueller matrix. Among the data expressed by the Mueller matrix, asymmetry indicating an overlay of the semiconductor substrate W may be expressed as an off-diagonal component. The degree of overlay can be expressed as Equation 1 below.

$$OVL = \alpha M_{offdiagoanal}(\theta, \varphi) \quad \text{[Equation 1]}$$

Here, OVL refers to the degree of overlay, α refers to the efficiency of the amount of light, $M_{offdiagoanal}$ refers to the asymmetry of a sample according to polarization, and (θ, φ) refers to the geometric information of the sample according to the direction of incident light.

The off-diagonal component of the Mueller matrix may include polarization information specific to the asymmetry of the sample. That is, physical information about the asymmetry of the sample may be obtained through the off-diagonal component of the Mueller matrix for all azimuths and angles of incidence. The off-diagonal components of the Mueller matrix shown in FIG. 2 may include $M_{02}$, $M_{03}$, $M_{12}$, $M_{13}$, $M_{20}$, $M_{21}$, $M_{30}$, and $M_{31}$.

Figure 3:
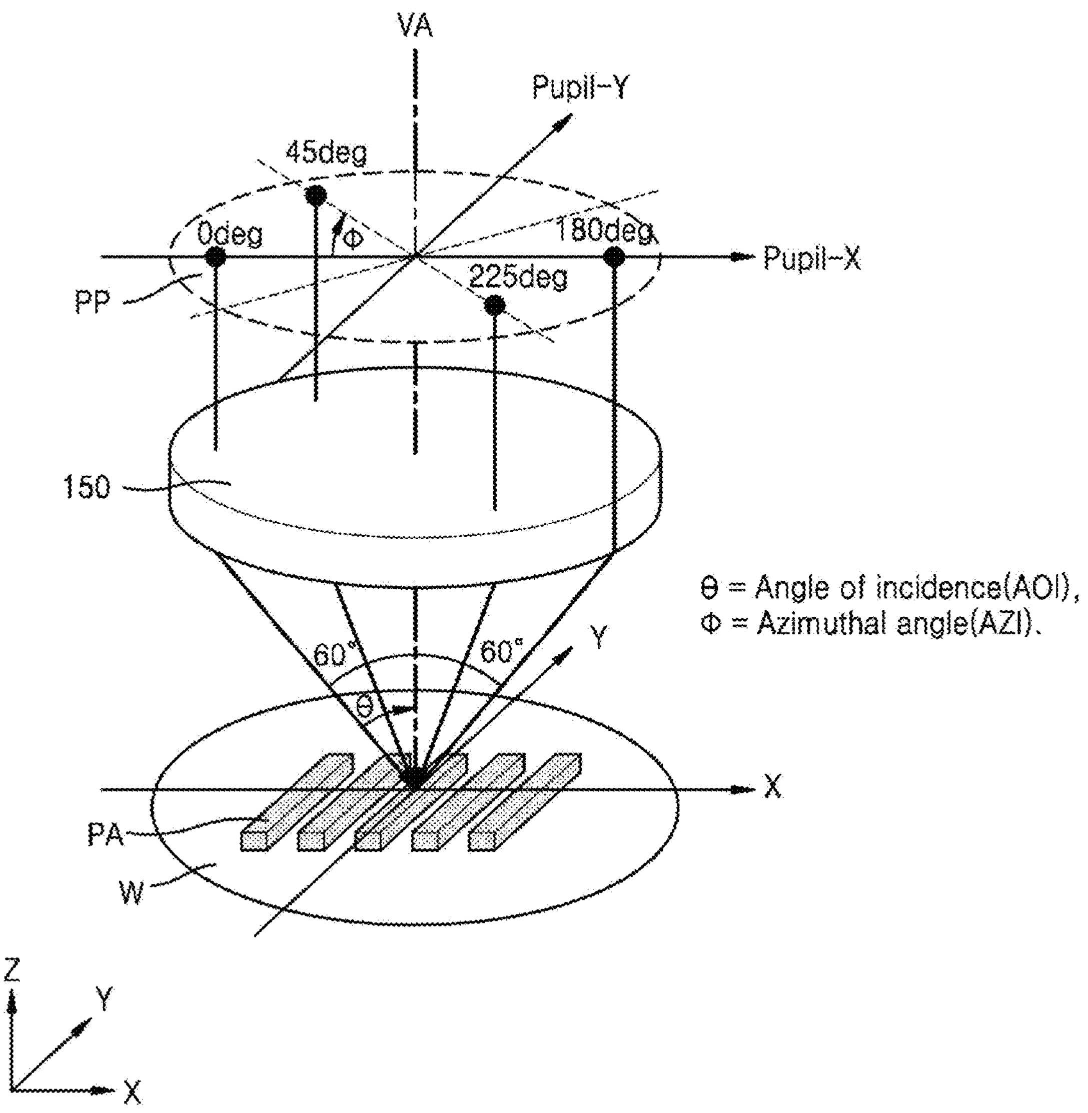
FIG. 3 is a diagram for describing components forming a pupil image of FIG. 1.

FIG. 3 is a diagram for describing components forming the pupil image of FIG. 1. Reference is made to FIG. 3 along with FIGS. 1 and 2.

The PP image of the semiconductor substrate W formed on the PP plane may include polarization information for various incident angles θ and azimuth angles φ.

The incident angle θ may be defined as an angle formed by polarized light passing through a specific point on the PP plane and incident on the semiconductor substrate W and a normal line VA perpendicular to the incident interface of the polarized light. The incident angle θ may be, for example, about 0° to about 60°, but is not limited thereto. In addition, the azimuth angle φ may be defined as an angle formed by a reference point on the PP plane and another point on the PP plane based on the normal line VA. That is, the azimuth angle φ may mean an angle from the horizontal axis on the PP plane. Accordingly, the PP image of the semiconductor substrate W may have polarization information for various angles at different points on the PP plane. The azimuth φ may be, for example, 0° to 360°, but is not limited thereto. As an example, in FIG. 3, measurements at azimuth angles φ of 0°, 45°, 180°, and 225° are shown. The light source 110 may output a plurality of beams of monochromatic light while sweeping with a predetermined wavelength width in a predetermined wavelength range. Accordingly, as shown in FIG. 3, the pupil image of the semiconductor substrate W may provide polarization information of at least three dimensions (incident angle θ, azimuth angle φ, and wavelength λ) at a one-shot.

Figure 4:
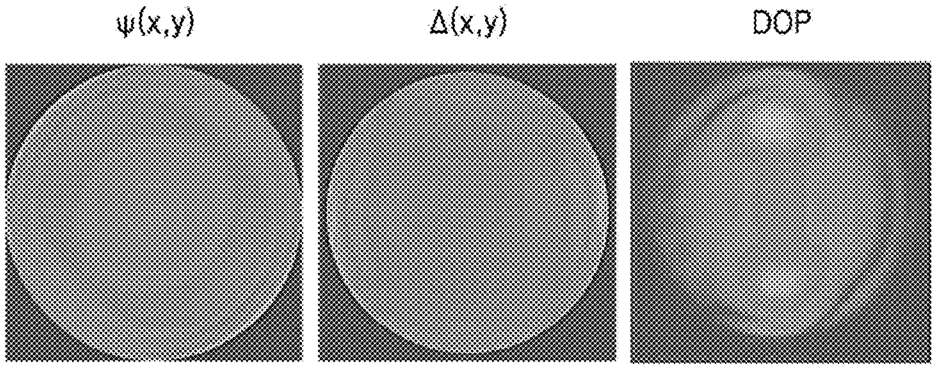
FIG. 4 shows photos illustrating pupil images including different information according to an embodiment of the present disclosure.

FIG. 4 shows photos illustrating pupil images including different information according to an embodiment of the present disclosure.

Reference is made to FIG. 4 along with FIGS. 1 to 3. As shown in FIG. 3, a PP image may be formed by the objective lens 150 by acquiring polarization information at a plurality of azimuth angles φ and a plurality of incidence angles θ. The intensity difference ψ, which is an ellipsometer parameter, may be obtained with respect to a plane in the horizontal direction, by converting the obtained polarization information. Here, the intensity difference ψ corresponds to the intensity ratio of a P wave and a S wave. In addition, a phase difference Δ may be obtained for a horizontal plane by converting the obtained polarization information. Here, the phase difference Δ may mean the phase difference between the P wave and the S wave. Finally, the degree of polarization (DOP) may be obtained by converting the obtained polarization information. Since the PP image may mean different incident angles θ and azimuth angles φ depending on the position of each pixel on the semiconductor substrate W, the intensity difference ψ, the phase difference Δ, and the degree of polarization (DOP) for various incident and azimuth angles θ and φ may all be obtained. In an embodiment, when using an objective lens having a numerical aperture (NA) of 0.95, an incidence angle θ may be measured from 0 to 72 degrees and an azimuth angle φ may be measured from 0 to 360 degrees.

Figure 5:
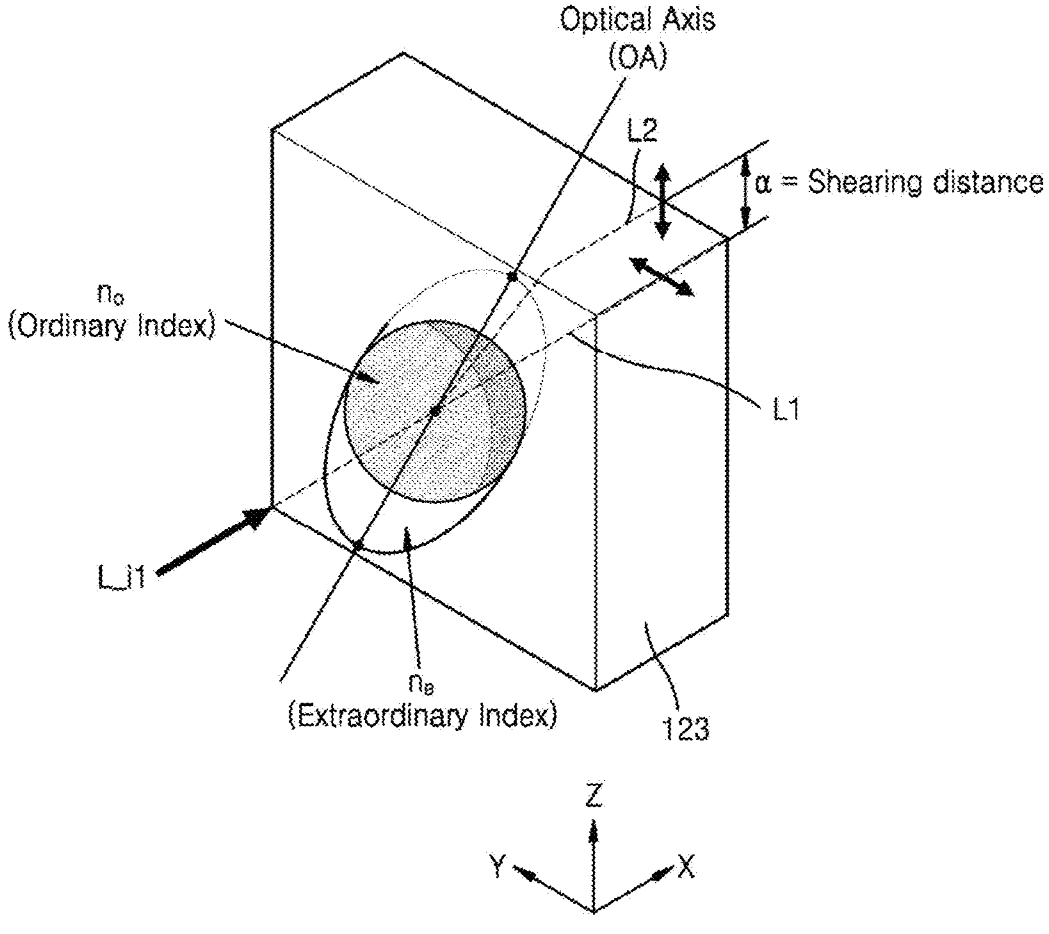
FIG. 5 is a diagram illustrating a polarization unit delayer and a multiplex self-interference generation unit delayer of FIG. 1.

FIG. 5 is a diagram illustrating the polarization unit delayer and the multiplex self-interference generation unit delayer of FIG. 1.

Reference is made to FIG. 5 along with FIGS. 1 to 4. Although FIG. 5 shows only the polarization unit delayer 123, such a structure may correspond to the multiplex self-interference generation unit delayer 133. Although FIG. 5 shows only the laser beam L_i1, the laser beam L_i1 may correspond to the beam L_i2 reflected from the top surface of the semiconductor substrate W, that is, the PP image. Although only the first beam L1 and the second beam L2 are illustrated in FIG. 5, the first beam L1 may correspond to the third beam L3, and the second beam L2 may correspond to the fourth beam L4.

The polarization unit delayer 123 may separate the laser beam L_i1 generated by the light source 110. The laser beam L_i1 may include a first horizontal component beam and a vertical component beam. The first horizontal component beam may be a polarization component (i.e., p-polarization component Z) of the laser beam L_i1 oscillating in a direction horizontal to the incident surface of the laser beam L_i1, and the vertical component beam may be a polarization component (i.e., s-polarization component Y) of the laser beam L_i1 oscillating in a direction perpendicular to the incident surface of the laser beam L_i1. The first beam L1 may correspond to the vertical component beam, and the second beam L2 may correspond to the first horizontal component beam.

Since the polarization unit delayer 123 has birefringence, the first horizontal component beam and the vertical component beam may have different refractive indices with respect to the polarization unit delayer 123. For example, the optical axis OA of the polarization unit delayer 123 may be arranged in the first plane (X-Y plane) including the traveling direction X and the p-polarization direction Y of the laser beam L_i1.

In this case, the second beam L2 may be an extraordinary wave with respect to the polarization unit delayer 123, and the first beam L1 may be an ordinary wave with respect to the polarization unit delayer 123. For example, the laser beam L_i1 may be vertically incident toward the polarization unit delayer 123. In this case, the second beam L2 may be refracted by the optical axis OA, and the first beam L1 may not be refracted. That is, the second beam L2 may be shifted in the p-polarization direction Z, and the first beam L1 may not be shifted. Accordingly, the polarization unit delayer 123 may separate the laser beam L_i1 into the first beam L1 and the second beam L2. The value of the second beam L2 shifted in the p-polarization direction Z may be defined as shearing distance. The ordinary index no may be a unit vector for a plane on which the ordinary wave, i.e., the first beam L1 is incident, and the extraordinary index ne may be a unit vector for a plane on which the extraordinary wave, i.e., the second beam L2 is incident.

Figure 6:
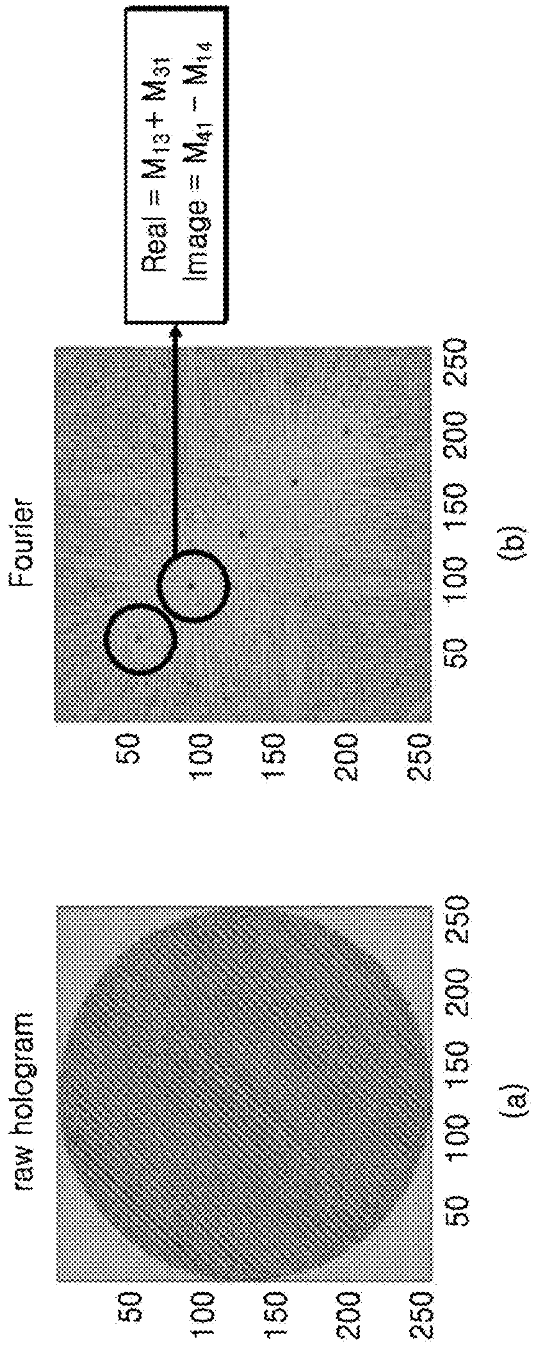
FIG. 6 shows photos illustrating a raw hologram of a pupil image and an image obtained by Fourier transform of the pupil image, according to an embodiment of the present disclosure.

FIG. 6 shows photos illustrating a raw hologram of a pupil image and an image obtained by Fourier transform of the pupil image according to an embodiment of the present disclosure.

Reference is made to FIG. 6 along with FIGS. 1 to 5. A photo (a) of FIG. 6 illustrates a two-dimensional (2D) interference image specialized for an overlay on the semiconductor substrate W. The 2D interference image may be generated through the multiplex self-interference by the multiplex self-interference generation unit 130 with respect to the PP image. A photo (b) of FIG. 6 illustrates an image processed by performing two-dimensional Fourier transform with respect to the photo (a) of FIG. 6. In the drawing after the two-dimensional Fourier transform, a peak may be generated at each specific coordinate, and each peak may include information on different overlays. The photo (b) in FIG. 6 may include a complex plane, and in one embodiment, the real value may be obtained as $M_{13}+M_{31}$, and the imaginary value may be obtained as $M_{41}-M_{14}$. However, the method of calculating the peak is not limited thereto.

Figure 7:
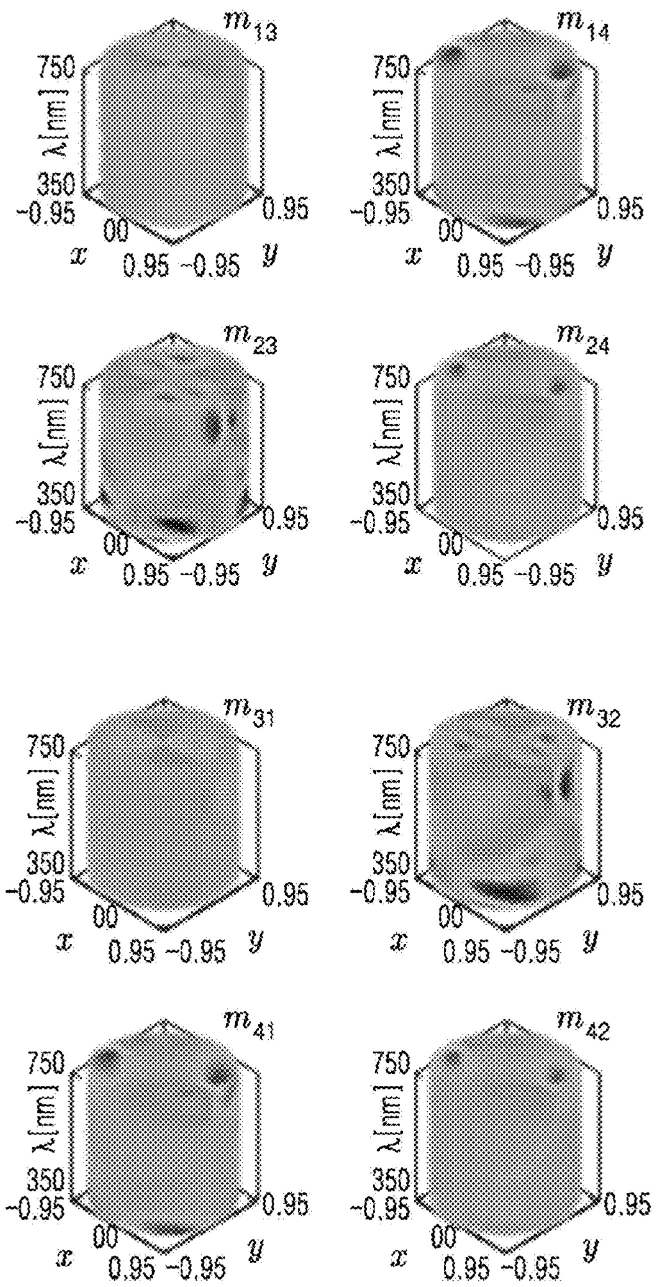
FIG. 7 illustrates graphs in which information on a pupil image measured for each wavelength is integrated with respect to an off-diagonal component of a Mueller matrix, according to an embodiment of the present disclosure.

FIG. 7 illustrates graphs in which information on a pupil image measured for each wavelength is integrated with respect to an off-diagonal component of a Mueller matrix according to an embodiment of the present disclosure.

Reference is made to FIG. 7 along with FIGS. 1 to 6. FIG. 7 shows graphs of the off-diagonal components of the Mueller matrix, respectively. More specifically, one off-diagonal component may be expressed by integrating the image of FIG. 6 by wavelength in three dimensions. The off-diagonal components may include asymmetric specialized polarization information, and in an embodiment, data measured for wavelengths from 350 nm to 750 nm may be integrated. Accordingly, polarization information may be analyzed for all azimuth angles and incident angles. That is, it is possible to check at what angle of incidence or at what wavelength the overlay changes sensitively for the sample.

Figure 8:
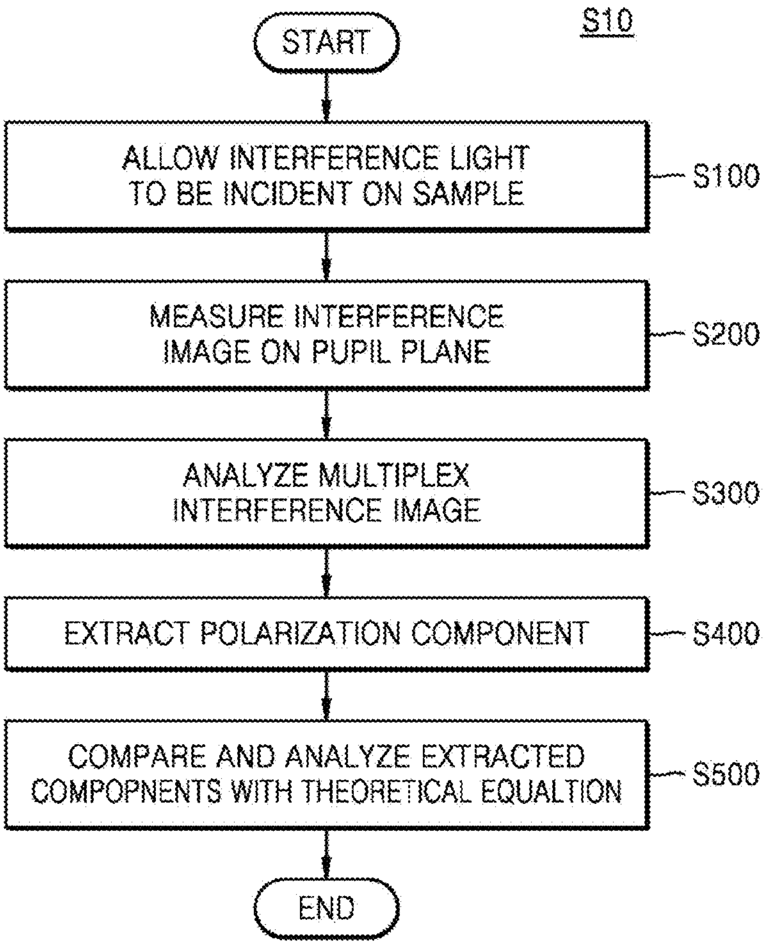
FIG. 8 is a flowchart illustrating a semiconductor measurement method used by a semiconductor measurement device according to an embodiment of the present disclosure.

FIG. 8 is a flowchart illustrating a semiconductor measurement method using a semiconductor measurement device according to an embodiment of the present disclosure.

Reference is made to FIG. 8 along with FIGS. 1 to 7.

The semiconductor measurement device 10 may perform the semiconductor measurement method S10 shown in FIG. 8.

The semiconductor measurement method S10 may include an operation S100 of allowing the interfered light to be incident onto the semiconductor substrate W, which is a sample. The light interfered in operation S100 may mean light interfered by the polarization unit delayer 123 included in the polarization unit 120 in FIG. 1.

The semiconductor measurement method S10 may include an operation S200 of measuring an interference image formed on the PP plane. The operation S200 may be performed by the detection unit 180. The image formed on the PP plane may be formed by the objective lens 150, and the interference image may be formed by the multiplex self-interference generation unit delayer 133 and an analyzer 132 included in the multiplex self-interference generation unit 130 with respect to the PP image.

The semiconductor measurement method S10 may include an operation S300 of analyzing a multiplex self-interference image. The operation S300 may be performed by the analysis unit 190. Details of operation S300 are described with reference to FIG. 9.

The semiconductor measurement method S10 may include an operation S400 of extracting a polarization component. The polarization component extracted in operation S400 means an off-diagonal component in a Mueller matrix including information on an interference image. The semiconductor measurement method S10 may include an operation S500 of comparing and analyzing the extracted components with a theoretical equation. The operations S400 and S500 may be performed by the analysis unit 190.

Figure 9:
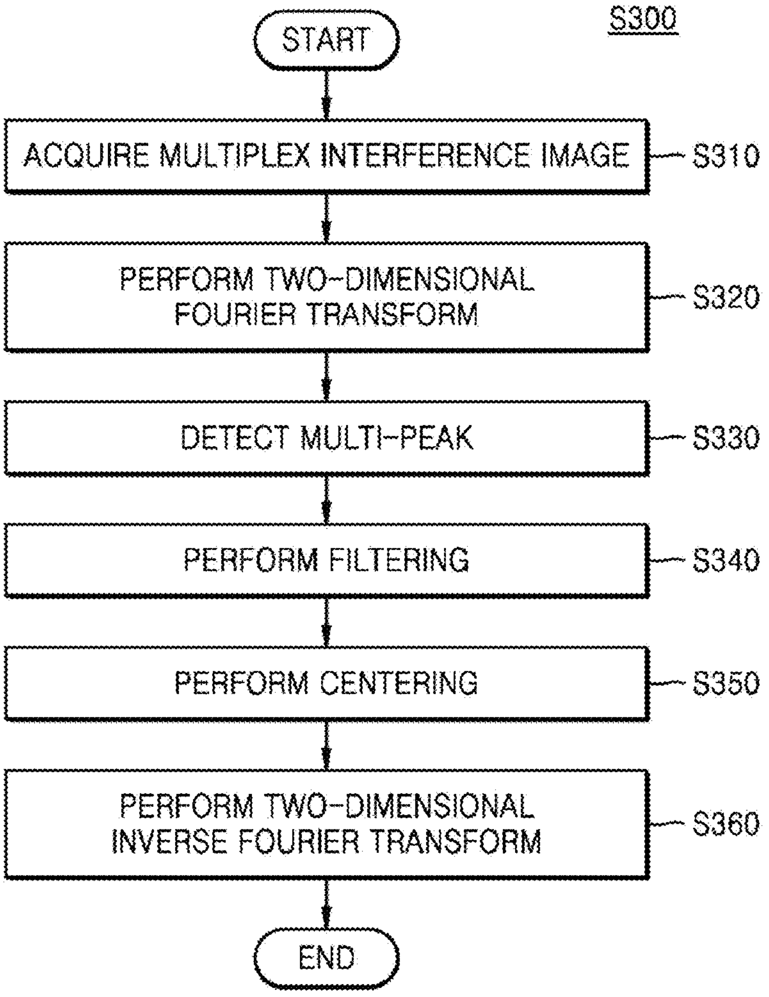
FIG. 9 is a detailed flowchart illustrating an operation of analyzing a multiplex interference image in a semiconductor measurement method according to an embodiment of the present disclosure.

FIG. 9 is a detailed flowchart illustrating an operation of analyzing a multiplex interference image in a semiconductor measurement method according to an embodiment of the present disclosure.

Reference is made to FIG. 9 along with FIGS. 1 to 8.

The operation S300 may include an operation S310 of acquiring a multiplex interference image. The multiplex interference image may correspond to the multiplex self-interference image semantically. The multiplex interference image may mean an image generated by the multiplex self-interference generation unit 130. The operation S300 may include an operation S320 of performing a two-dimensional Fourier transform on the acquired multiplex interference image. When performing two-dimensional Fourier transform, an image as shown in, e.g., photo (b) of FIG. 6 may be acquired. The operation S300 may include an operation S330 of detecting a multi-peak for an image on which two-dimensional Fourier transform has been performed, a filtering operation S340, and a centering operation S350. The operations S330, S340, and S350 may be defined as operations of separating a signal for each interference from the transformed image. The operation S300 may include an operation S360 of performing two-dimensional inverse Fourier transform on the signal separated through the operations S330, S340, and S350. That is, the two-dimensional inverse Fourier transform may be performed on the signal separated through the operations S330, S340, and S350 to acquire a signal of the PP plane.

Figure 10:
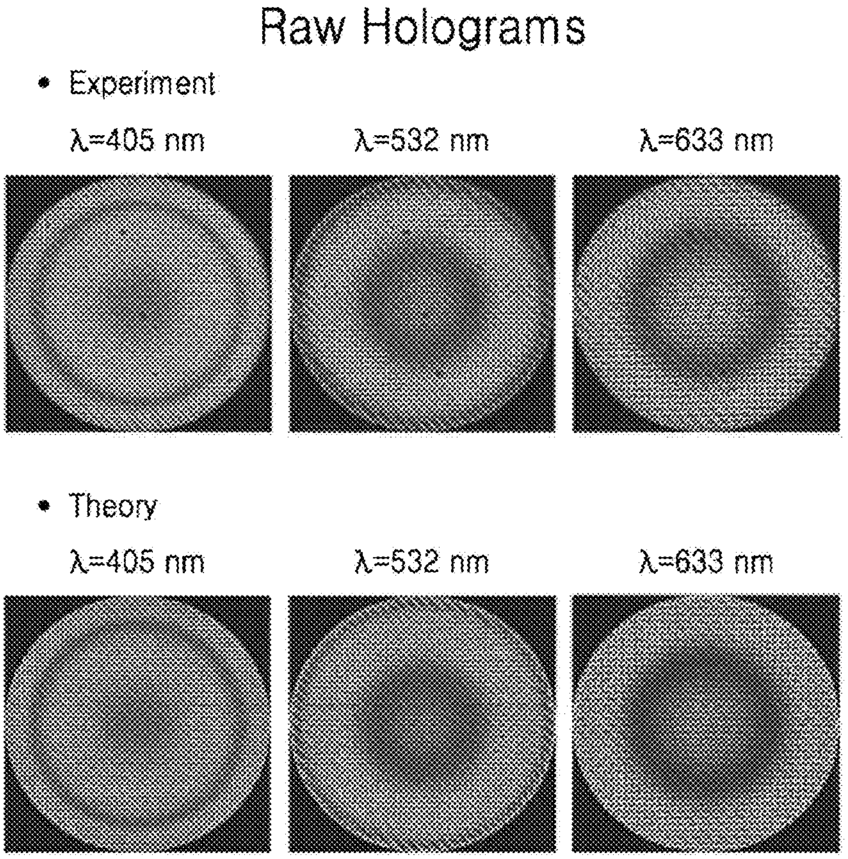
FIG. 10 illustrates pupil images for respective wavelengths measured through an experiment and pupil images for respective wavelengths according to theory.

FIG. 10 illustrates pupil images for respective wavelengths measured through an experiment and pupil images for respective wavelengths according to a theory.

Referring to FIG. 10, three images in a first row are pupil images for respective wavelengths measured through an experiment, and three images in a second row are pupil images for respective wavelengths theoretically estimated. The measured wavelengths are 405 nm, 532 nm, and 633 nm in an embodiment. It may be confirmed that the experimental images and the theoretical images arranged in each of the columns correspond to each other, and through this, it is possible to confirm the technical effect that the reliability of the semiconductor measurement device is high.

Figure 11:
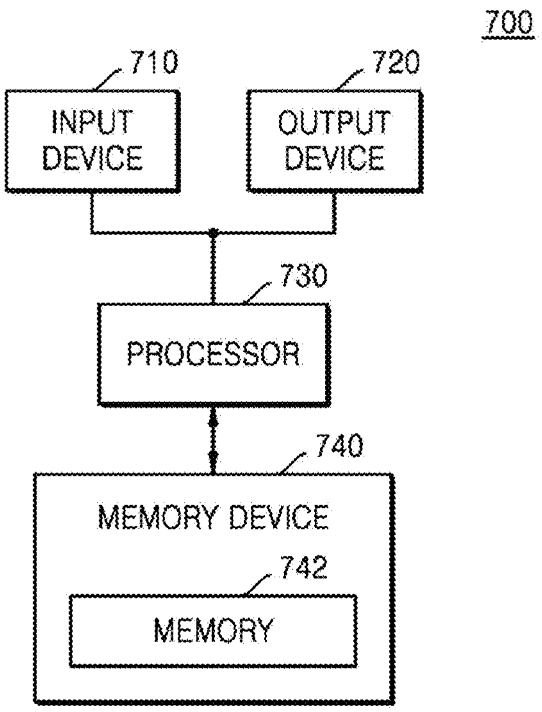
FIG. 11 is a block diagram of an information processing system including a semiconductor device measured by a semiconductor measurement device according to an embodiment of the present disclosure.

FIG. 11 is a block diagram of an information processing system including a semiconductor device measured by a semiconductor measurement device according to an embodiment of the present disclosure.

Referring to FIG. 11, an information processing system 700 includes an input device 710, an output device 720, a processor 730, and a memory device 740. In some embodiments, the memory device 740 may include a cell array including nonvolatile memory cells and a peripheral circuit for operations such as read/write. In some other embodiments, the memory device 740 may include a nonvolatile memory device and a memory controller.

A memory 742 included in the memory device 740 may include a semiconductor device measured by the semiconductor measurement device 10 according to embodiments described with reference to FIGS. 1 to 10.

The processor 730 may be respectively connected to the input device 710, the output device 720, and the memory device 740 through interfaces to control the overall operations.

Figure 12:
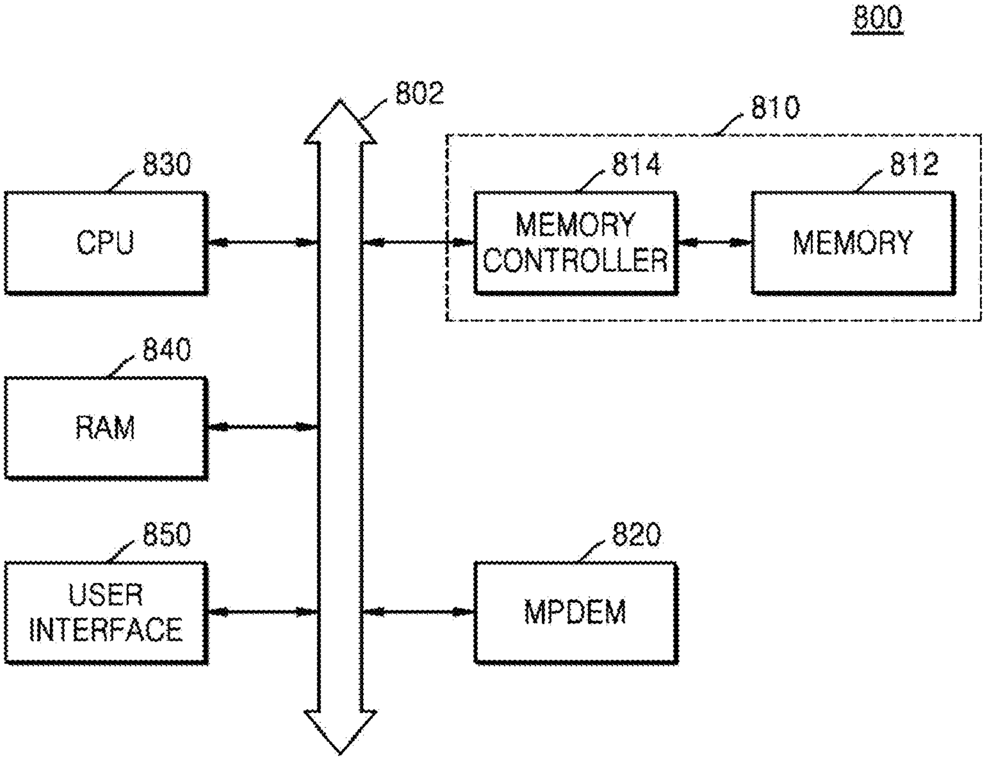
FIG. 12 is a block diagram of an electronic system including a semiconductor device measured by a semiconductor measurement device according to an embodiment of the present disclosure.

FIG. 12 is a block diagram of an electronic system including a semiconductor device measured by a semiconductor measurement device according to an embodiment of the present disclosure.

Referring to FIG. 12, an electronic system 800 includes a nonvolatile memory system 810, a modem 820, a central processing unit 830, a random access memory (RAM) 840, and a user interface 850 electrically connected to a bus 802.

The nonvolatile memory system 810 may include a memory 812 and a memory controller 814. The nonvolatile memory system 810 stores data processed by the central processing unit 830 or data input from the outside.

The nonvolatile memory system 810 may include a nonvolatile memory such as magnetoresistive RAM (MRAM), phase change RAM (PRAM), resistive RAM (RRAM), and ferroelectric RAM (FRAM). At least one of the memory 812 and the RAM 840 may include a semiconductor device measured by the semiconductor measurement device 10 according to embodiments described with reference to FIGS. 1 to 10.

The electronic system 800 may be used in a portable computer, a web tablet, a wireless phone, a mobile phone, a digital music player, a memory card, an MP3 player, navigation, a portable multimedia player (PMP), a solid state disk (SSD), or a household hold appliance.

Figure 13:
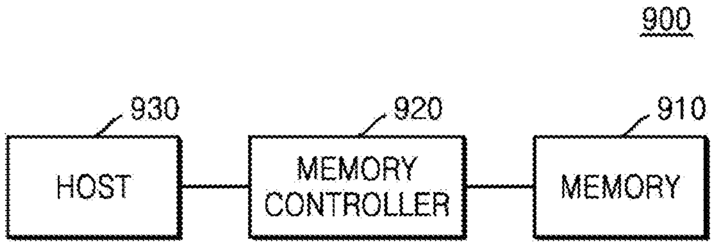
FIG. 13 is a block diagram of a memory card including a semiconductor device measured by a semiconductor measurement device according to an embodiment of the present disclosure.

FIG. 13 is a block diagram of a memory card including a semiconductor device measured by a semiconductor measurement device according to an embodiment of the present disclosure.

The memory card 900 includes a memory 910 and a memory controller 920.

The memory 910 may store data. In some embodiments, the memory 910 has a nonvolatile property capable of maintaining stored data even when power supply is interrupted. The memory 910 may include a semiconductor device measured by the semiconductor measurement device 10 according to embodiments described with reference to FIGS. 1 to 10.

The memory controller 920 may read data stored in the memory 910 or store data in the memory 910 in response to a read/write request from a host 930.

While the inventive concept has been particularly shown and described with reference to embodiments thereof, it will be understood that various changes in form and details may be made therein without departing from the spirit and scope of the following claims.

What is claimed is:

1. A semiconductor measurement device comprising:
a light source configured to generate a laser beam;
a polarization unit arranged on a path of the laser beam generated from the light source, and configured to separate the laser beam into a first beam and a second beam;
a beam splitter configured to make the first beam and the second beam, having been separated by the polarization unit, incident on a top surface of a semiconductor substrate;
a multiplex self-interference generation unit configured to separate a beam reflected from the top surface of the semiconductor substrate into a third beam and a fourth beam and to generate multiplex self-interference among the third beam and the fourth beam;
a detection unit configured to detect a multiplex self-interference image generated from the third beam and the fourth beam; and
an analysis unit configured to calculate a degree of polarization (DOP) by extracting only off-diagonal components of Mueller matrix components based on the multiplex self-interference image, wherein
the polarization unit comprises a polarization unit delayer.

2. The semiconductor measurement device of claim 1, wherein the polarization unit further comprises:
a polarization unit lens array including at least two lenses; and
a polarizer.

3. The semiconductor measurement device of claim 2, wherein the polarization unit delayer is spaced apart from the polarization unit lens array in a direction parallel to a traveling direction of the laser beam.

4. The semiconductor measurement device of claim 2, wherein the polarizer is arranged between the polarization unit lens array and the polarization unit delayer.

5. The semiconductor measurement device of claim 2, wherein
the polarizer S-polarizes the first beam, and P-polarizes the second beam, and
the polarization unit delayer is configured to delay a phase of each of the first beam and the second beam.

6. The semiconductor measurement device of claim 2, wherein the multiplex self-interference generation unit comprises:
a multiplex self-interference generation unit delayer;
a multiplex self-interference generation unit lens array including at least two lenses; and
an analyzer.

7. The semiconductor measurement device of claim 6, wherein the analyzer and the multiplex self-interference generation unit delayer are arranged between the at least two lenses of the multiplex self-interference generation unit lens array.

8. The semiconductor measurement device of claim 6, further comprising an objective lens vertically spaced apart from the beam splitter, wherein the objective lens is configured to focus each of the first beam and the second beam onto the semiconductor substrate and to generate a pupil image of the semiconductor substrate from beams reflected from the semiconductor substrate.

9. The semiconductor measurement device of claim 8, wherein the multiplex self-interference generation unit delayer is configured to delay a phase of each of the third beam and the fourth beam separated from the beam reflected from the top surface of the semiconductor substrate, and the third beam is S-polarized, and the fourth beam is P-polarized.

10. A semiconductor measurement device comprising:

a polarization unit configured to separate a laser beam output from a light source into a plurality of beams, each having different polarization information;

an objective lens configured to focus the plurality of beams onto a semiconductor substrate and to generate a pupil image from beams reflected from the semiconductor substrate;

a multiplex self-interference generation unit configured to separate the pupil image, corresponding to a beam reflected from a top surface of the semiconductor substrate, into a plurality of beams and to generate multiplex self-interference among the plurality of beams;

a detection unit configured to detect a multiplex self-interference image generated from the pupil image; and an analysis unit configured to extract only an off-diagonal component from Mueller matrix components based on the multiplex self-interference image, wherein the polarization unit comprises a polarization unit delayer, a polarization unit lens array including at least two lenses, and a polarizer, the polarization unit delayer is spaced apart from the polarization unit lens array in a direction parallel to a traveling direction of the laser beam, and the multiple self-interference generation unit comprises a multiplex self-interference generation unit delayer, a multiplex self-interference generation unit lens array including at least two lenses, and an analyzer.

11. The semiconductor measurement device of claim 10, wherein each of the polarization unit delayer and the multiplex self-interference generation unit delayer comprises any one of a beam displacer, a Wollaston prism, a polarizing prism, a grating, or a combination thereof.

12. The semiconductor measurement device of claim 10, wherein the polarizer polarizes the plurality of beams into an S-polarized first beam and a P-polarized second beam, and the polarization unit delayer is configured to delay a phase of each of the first beam and the second beam.

13. The semiconductor measurement device of claim 10, wherein the multiplex self-interference generation unit delayer is configured to delay a phase of each of a third beam and a fourth beam separated from the pupil image, wherein the third beam is S-polarized, and the fourth beam is P-polarized.

14. The semiconductor measurement device of claim 10, wherein the detection unit comprises one of a complementary metal oxide semiconductor (CMOS), a charged coupled device (CCD), or a combination thereof.

15. The semiconductor measurement device of claim 10, wherein the analysis unit is configured to calculate a degree of polarization (DOP) through the extracted off-diagonal component.

16. The semiconductor measurement device of claim 10, wherein the analysis unit is configured to perform an operation of analyzing the multiplex self-interference image, and the operation of analyzing the multiplex self-interference image comprises:

an operation of performing a two-dimensional Fourier transformation on the multiplex self-interference image;

an operation of detecting a multi-peak for the two-dimensional Fourier transformed multiplex self-interference image; and an operation of performing two-dimensional Fourier inverse transformation on a plurality of interference signals separated in the detecting operation.

17. The semiconductor measurement device of claim 16, wherein the operation of analyzing the multiplex self-interference image further comprises:

between the operation of detecting the multi-peak and the operation of performing the two-dimensional Fourier inverse transformation, an operation of filtering the plurality of interference signals separated in the operation of detecting the multi-peak; and an operation of performing centering to match a central axis with respect to the plurality of filtered interference signals.

18. A semiconductor measurement device comprising:

a light source configured to generate a laser beam;

a polarization unit configured to separate the laser beam into a first beam and a second beam, each having different polarization information;

a beam splitter configured to allow a plurality of beams having different polarization information to be incident onto a top surface of a semiconductor substrate;

an objective lens spaced vertically from the beam splitter and configured to generate a pupil image from beams reflected from the semiconductor substrate;

a multiplex self-interference generation unit configured to separate the pupil image, corresponding to a beam reflected from the top surface of the semiconductor substrate, into a third beam and a fourth beam, each having different polarization information, and to generate multiplex self-interference among the third beam and the fourth beam;

a detection unit configured to detect a multiplex self-interference image generated from the pupil image, and an analysis unit configured to calculate a degree of polarization (DOP) by extracting only an off-diagonal component of Mueller matrix components based on the multiplex self-interference image, wherein the polarization unit comprises a polarization unit delayer configured to delay a phase of each of the first beam and the second beam, and the multiplex self-interference generation unit comprises a multiplex self-interference generation unit delayer configured to delay a phase of each of the third beam and the fourth beam.

19. The semiconductor measurement device of claim 18, wherein the analysis unit is configured to perform an operation of analyzing the multiplex self-interference image, and the operation of analyzing the multiplex self-interference image comprises:

an operation of performing a two-dimensional Fourier transformation on the multiplex self-interference image;

an operation of detecting a multi-peak for the two-dimensional Fourier transformed multiplex self-interference image;

an operation of filtering a plurality of interference signals separated in the detecting operation;

an operation of performing centering to match a central axis with respect to the plurality of filtered interference signals; and an operation of performing two-dimensional Fourier inverse transformation on the plurality of interference signals separated in the detecting operation.

* * * * *